(12) United States Patent
Srinath et al.

(10) Patent No.: US 9,407,265 B2
(45) Date of Patent: Aug. 2, 2016

(54) INTEGRATED CIRCUIT WITH SIGNAL ASSIST CIRCUITRY AND METHOD OF OPERATING THE CIRCUIT

(71) Applicant: ARM LIMITED, Cambridge (GB)

(72) Inventors: Srinivasan Srinath, Bangalore (IN); Ambica Ashok, Bangalore (IN); Fakhruddin Ali Bohra, Bangalore (IN)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 14/088,570

(22) Filed: Nov. 25, 2013

(65) Prior Publication Data
US 2015/0091609 A1 Apr. 2, 2015

(30) Foreign Application Priority Data
Sep. 27, 2013 (IN) .............................. 2883/DEL/2013

(51) Int. Cl.
*H03K 19/096* (2006.01)
*H03K 19/017* (2006.01)
*H03K 19/00* (2006.01)
*H03K 19/094* (2006.01)
*G11C 11/419* (2006.01)
*G11C 7/12* (2006.01)

(52) U.S. Cl.
CPC ........ *H03K 19/01721* (2013.01); *G11C 11/419* (2013.01); *H03K 19/0013* (2013.01); *H03K 19/0963* (2013.01); *H03K 19/09429* (2013.01); *G11C 7/12* (2013.01)

(58) Field of Classification Search
CPC ............ G11C 7/02; G11C 7/12; G11C 11/41; G11C 15/00; H03K 3/012; H03K 3/356121; H03K 19/00361; H03K 19/00384; H03K 19/0963; H03K 19/17704; H03K 19/17728

USPC ........... 326/27, 29, 31, 34, 37, 47–50, 56, 57, 326/62, 95, 98; 327/198–218
See application file for complete search history.

(56) References Cited

U.S. PATENT DOCUMENTS

| 5,619,149 A | 4/1997 | Lev et al. |
|---|---|---|
| 6,069,512 A * | 5/2000 | Rodriguez ............. H03K 3/012 327/200 |
| 6,424,195 B2 * | 7/2002 | Samala .......................... 327/200 |
| 6,437,625 B1 * | 8/2002 | Kojima ............ H03K 3/356121 327/208 |
| 6,690,204 B1 * | 2/2004 | Belluomini ........ H03K 19/0963 326/112 |

(Continued)

OTHER PUBLICATIONS

Search Report issued in Great Britain Application No. GB1414195.6 dated Feb. 2, 2015 (4 pages).

*Primary Examiner* — Jason M Crawford
*Assistant Examiner* — Kurtis R Bahr
(74) *Attorney, Agent, or Firm* — Pramudji Law Group PLLC; Ari Pramudji

(57) ABSTRACT

An integrated circuit has signal assist circuitry for assisting with pulling a signal on the signal line towards the logical low or high signal level. The signal assist circuitry comprises first and second assist circuits. The first assist circuit couples the signal line to the logical high signal level following a pullup transition of the signal and provides a floating signal level following a pulldown transition, while the second assist circuit provides the floating signal level following the pullup transition and provides the logical low signal level following the pulldown transition. By providing complementary first and second assist circuits, each circuit can be optimized for the opposite transition to achieve improved performance or power consumption.

20 Claims, 6 Drawing Sheets

(56) References Cited

U.S. PATENT DOCUMENTS

| | | | |
|---|---|---|---|
| 6,737,888 B1 * | 5/2004 | Lattimore | H03K 19/0963 326/121 |
| 6,914,453 B2 * | 7/2005 | Dhong | H03K 19/0963 326/93 |
| 7,167,385 B2 * | 1/2007 | Chan | G11C 15/00 365/203 |
| 7,286,423 B2 * | 10/2007 | Ramaraju | G11C 7/02 365/189.14 |
| 7,372,305 B1 * | 5/2008 | Ngo | G01R 31/318541 326/93 |
| 7,479,807 B1 * | 1/2009 | Cheng | H03K 19/00384 326/121 |
| 7,557,616 B2 * | 7/2009 | Klim | H03K 19/0963 326/121 |
| 7,652,507 B1 | 1/2010 | Masleid et al. | |
| 7,772,891 B1 * | 8/2010 | Yang | G01R 31/318533 326/95 |
| 8,659,963 B2 * | 2/2014 | Dengler | G11C 7/12 365/203 |
| 2006/0071686 A1 | 4/2006 | Chang | |
| 2006/0280003 A1 | 12/2006 | Kolla et al. | |
| 2008/0029839 A1 | 2/2008 | Hold et al. | |
| 2009/0147590 A1 | 6/2009 | Correale, Jr. et al. | |
| 2010/0164447 A1 | 7/2010 | Masleid | |
| 2011/0317496 A1 | 12/2011 | Bunce et al. | |
| 2014/0112060 A1 * | 4/2014 | Adams | G11C 7/12 365/154 |

* cited by examiner

New Gdl Keeper-Low Assist Circuitry allows:
- Read word-line to turn off, and local bit-line precharge to turn on before output latch enable closes. Faster read cycle-times can be achieved.
- Local bit-line to precharge high before output latch enable closes. Gdl will not float, and output latch data is not affected.

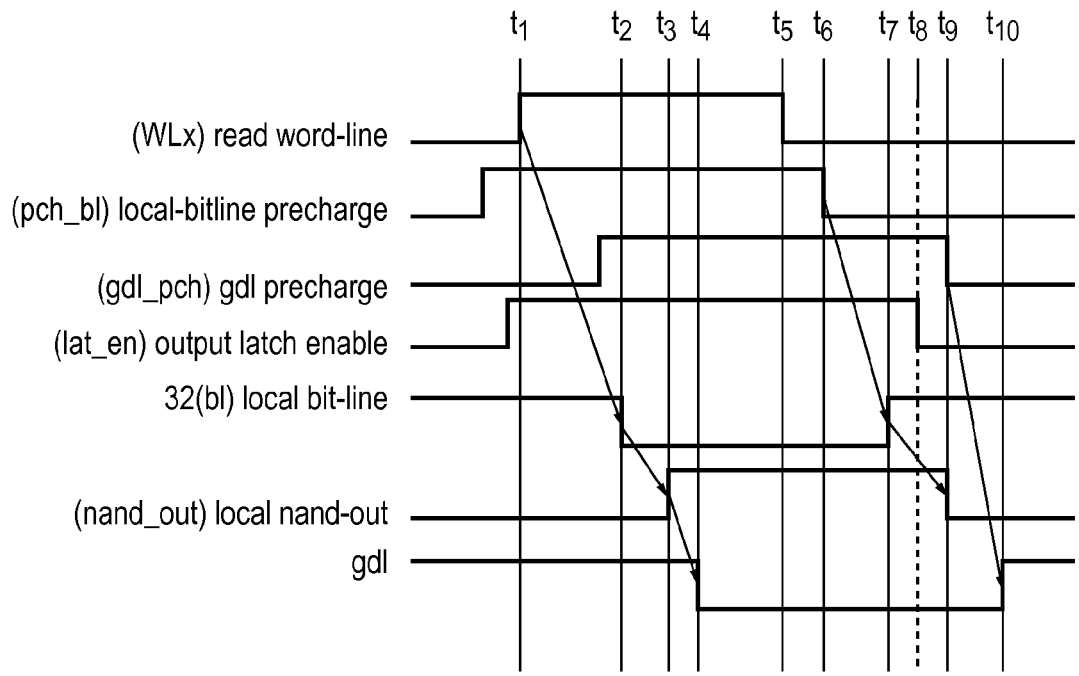

New Gdl Keeper-Low Assist Circuitry allows:
- Read word-line to turn off, and local bit-line precharge to turn on before output latch enable closes. Faster read cycle-times can be achieved.
- Local bit-line to precharge high before output latch enable closes. Gdl will not float, and output latch data is not affected.
- *gdl precharge R (shut-off) is required only before local nand-out R

FIG. 4B

INTEGRATED CIRCUIT WITH SIGNAL ASSIST CIRCUITRY AND METHOD OF OPERATING THE CIRCUIT

CROSS REFERENCE OF RELATED APPLICATION

The disclosure of Indian Patent Application No. 2883/DEL/2013 filed on Sep. 27, 2013 is incorporated herein by reference.

TECHNICAL FIELD

The present technique relates to the field of integrated circuits. More particularly, the present technique relates to an integrated circuit having signal assist circuitry for assisting with pulling a signal on a signal line to a logical low signal level or logical high signal level.

TECHNICAL BACKGROUND

An integrated circuit may have a latch circuit for capturing the signal level of a signal line within the integrated circuit. For example, in a memory the latch may capture the signal on a bitline for reading a data value from a memory cell. To ensure correct circuit operation, following a transition of the signal level on the signal line it is important that the latch captures the new signal level before the signal level changes for a following cycle. This constrains the operating frequency and operating voltage with which the integrated circuit can operate, and so can limit performance or energy efficiency.

A signal assist circuit may be provided to help with pulling the signal up or down to a logical high signal level or logical low signal level respectively. This helps speed up transitions of the signal level on the signal line, to allow operating frequency to be increased or operating voltage to be decreased. The present technique seeks to provide an improved signal assist circuit for the integrated circuit.

SUMMARY OF THE PRESENT TECHNIQUE

Viewed from one aspect, the present technique provides an integrated circuit comprising:

a signal line for carrying a signal with a signal level at one of a logical low signal level and a logical high signal level depending on an output of predetermined circuitry;

a latch circuit configured to capture the signal level of the signal on the signal line; and signal assist circuitry configured to assist with pulling the signal on the signal line towards the logical low signal level and to assist with pulling the signal on the signal line towards the logical high signal level;

the signal assist circuitry comprising:

a first assist circuit configured to couple a first node of the signal line to a first supply node for supplying the logical high signal level following a pullup transition of the signal from the logical low signal level towards the logical high signal level, and configured to provide a floating signal level to the first node following a pulldown transition of the signal from the logical high signal level towards the logical low signal level; and a second assist circuit configured to couple a second node of the signal line to a second supply node for supplying the logical low signal level following the pulldown transition, and configured to provide a floating signal level to the second node following the pullup transition.

The signal assist circuitry comprises first and second assist circuits for assisting with pulling the signal on the signal line towards the logical low signal level or the logical high signal level, to improve performance and energy efficiency. The signal on the signal line is dependent on the output of predetermined circuitry, and once the signal starts to transition in response to the output circuitry, the signal assist circuitry can help to boost the speed of the transition and ensure that following the transition the signal will remain at one of the logical low or high signal levels rather than floating. Hence, the signal assist circuit helps to enhance the noise margin of the signal on the signal line, reducing the likelihood of the signal being in an indeterminate state between the logical low and high signal levels at the time when it is captured by the latch.

The first and second assist circuits operate in a complementary manner to assist with opposite transitions/signal levels of the signal on the signal line. The first assist circuit couples a first node of the signal line to a first supply node supplying the logical high signal level following a pullup transition from the logical low signal level towards the logical high level, and provides a floating signal level to the first node following a pulldown transition from the logical high signal level towards the logical low signal level. On the other hand, the second assist circuit couples a second node of the signal line to a second supply node supplying the logical low signal level and provides a floating signal level to the second node following the pullup transition. Hence, each of the first and second assist circuits is active during one of the states of the signal line and is inactive (providing a floating level) for the other state.

This contrasts with known signal assist circuits for which a common assist circuit provides assistance for both the pullup and pulldown transitions. This previous approach is less advantageous because the common assist circuit has to be capable of handling both transitions and so the sizing and configuration of the circuit must be determined as a compromise suitable for both transitions, which limits performance and/or operating voltage range. In contrast, by providing complementary first and second assist circuits dedicated to handling opposite transitions/levels of the signal line, it is possible to optimize the design of each of the first and second assist circuits for handling one transition only, without affecting performance for the other transition. This enables faster transitions of the signal line and a more aggressive scaling of the operating frequency or the operating voltage to achieve improved performance or power consumption.

In one example, the first and second assist circuits may comprise respective half latch circuits. This contrast to a previous approach where a full latch circuit has been used as a common assist circuit which is active for both the pullup and pulldown transitions of the signal on the signal line. By providing independent and complementary half latch circuits which each provide assistance following a different one of the pullup or pulldown transitions, the half latch circuits can be independent of each other and the sizing of one does not affect the assistance provided by the other. This enables improved performance and power consumption.

Although a number of circuit arrangements can be provided as the first and second assist circuits, a particular example provides the first assist circuit with a first inverter which inverts the signal on the signal line, and a p-type transistor coupled between the first node and the first supply node whose gate terminal receives the inverted signal generated by the first inverter. When the signal on the signal line starts moving towards the logical high signal level (a pullup transition), then when the signal rises beyond a threshold level, the first inverter will switch and output a low signal level, turning on the p-type transistor so that the signal line is then pulled up quickly to the logical high signal level and is maintained at that level by the first assist circuit. Conversely, the second assist circuit may include a second inverter, and an n-type transistor coupled between the second node and the second supply node, with the gate of the n-type transistor receiving the inverted signal generated by the second inverter. Hence, when the signal on the signal line starts transitioning low (a pulldown transition), then when the signal drops below the switch point of the second inverter, the n-type transistor is turned on, pulling the signal line down to the logical low signal level faster than would be the case if the signal assist circuit was not provided. The p-type transistor turns off following a pulldown transition and the n-type transistor turns off following a pullup transition, so that the first/second assist circuits do not influence the signal on the signal line when the other of the first/second assist circuits is active, allowing each of the first/second assist circuits to be sized independently to achieve the advantages discussed above.

As mentioned above, the first assist circuit is coupled to a first node of the signal line and the second assist circuit is coupled to a second node. In some embodiments, the first and second nodes may be the same node of the signal line, while in other embodiments, the first and second nodes may be different nodes.

In some examples, the integrated circuit may have precharge circuitry which precharges the signal line to the logical high signal level, which can be useful for example if the signal line needs to be at the logical high signal level in time for a particular event within the integrated circuit or the predetermined circuitry. For example, in a memory a bitline may be precharged to the logical high signal level by the precharge circuitry, and then the level on the bitline may either drop to the logical low signal level or remain at the logical high signal level depending on the state of a memory cell being read. The signal assist circuit of the present technique is particularly useful in a circuit having precharge circuitry. When the signal line has been precharged, then any subsequent transition of the signal line to the logical low signal level can be made faster using the second assist circuit of the signal assist circuitry. On the other hand, the first assist circuit will maintain the signal line at the logical high signal level following precharging, so that if there is no event at the predetermined circuitry which causes a pulldown transition, then the signal line will remain at the logical high signal level and will not float. Hence, in both cases the noise tolerance can be improved and performance made faster using the signal assist circuit.

It can be useful to provide the second assist circuit with a normal mode and a tristate mode. In the normal mode, the second assist circuit may function as discussed above, coupling the second node to the second supply node following the pulldown transition and providing a floating signal level to the second node following the pullup transition. However, in the tristate mode, a floating signal level may be provided to the second node by the second assist circuit regardless of the state of the signal line. For example a tristating transistor coupled between the second node and the second supply node may be provided for implementing the tristate mode. Hence, during the normal mode the tristating transistor can be made conductive, while during the tristate mode the tristating transistor may decouple the second node from the second supply node so that the effect of the second assist circuit is removed. The tristate mode can be useful for enabling the signal line to be pulled quickly up to the logical high signal level without a competing pull-down being provided by the second assist circuit. For example, where precharge circuitry is provided as discussed above, the second assist circuit may operate in the tristate mode when the precharge circuitry is active to ensure that the bitline can be quickly pulled up to the logical high signal level. On the other hand, when the precharge circuitry is not currently active then the second assist circuit may be provided in the normal mode. For example, a precharge signal provided to the precharge circuitry to control the precharging may also be used by the second assist circuit to select whether to operate in the normal mode or tristate mode.

The present technique may be applied to a range of different types of integrated circuits. In general, the signal assist circuitry may be used for any integrated circuit where a latch circuit captures a signal level from a signal line which depends on an output of some kind of predetermined circuitry. Any dynamic circuits feeding into a latch down stream that necessitates noise margin protection and signal boosting during both the logical high and logical low states of the signal on the signal line can use the claimed signal assist circuitry. The predetermined circuitry does not necessarily need to be part of the same integrated circuit as the signal assist circuitry, and could be an external circuit.

However, the present technique is particularly useful for a memory, such as a static random access memory (SRAM) or other kinds of embedded memory. For example, the signal line may comprise a bitline of the memory and the predetermined circuitry may comprise one or more memory cells. Bitlines in a memory are used to read values from memory cells. The signal assist circuitry helps improve the performance of the memory, because it allows the signal on the bitline to switch between states more quickly, and helps maintain the signal at its current level while upstream circuitry begins to change state for a following cycle, to allow a higher operating frequency or lower operating voltage.

The signal line could be a local bitline which is coupled directly to a particular column of memory cells.

However, in other examples the signal may comprise a global bitline which is coupled to a plurality of local bitlines of the memory. Some memories have a hierarchical bitline structure in which a number of local bitlines coupled to respective memory cells then feed into a global bitline whose output switches if any of the connected local bit lines switch state. This arrangement is useful for reducing the number of sense amplifiers required in a memory. Without the signal assist circuitry, following one read operation the precharging of the local bitlines for a subsequent read operation in the following cycle would have to wait until the latch has captured the value from the global bitline, otherwise the latch may capture the wrong value. However, the signal assist circuitry according to the present technique allows precharging of the local bitlines to start before or in parallel with the latch capturing the signal level of the global bitline, because the signal assist circuitry can maintain the signal level of the global bitline at its current level even if precharging of the local bitlines has started. The global bitline precharging may start later than the local bitline precharging, once the signal level on the global bitline for the previous cycle has already been captured by the latch. By staggering the local and global bitline precharging in this way, the local bitline precharging can start earlier than would be the case if the signal assist circuitry was not provided, and the overall operating frequency of the memory can be increased to improve performance.

Viewed from another aspect, the present technique provides an integrated circuit comprising:

signal line means for carrying a signal with a signal level at one of a logical low signal level and a logical high signal level depending on an output of predetermined circuitry;

latch circuit means for capturing the signal level of the signal on the signal line means; and signal assist circuit means for assisting with pulling the signal on the signal line means towards the logical low signal level and assisting with pulling the signal on the signal line means towards the logical high signal level;

the signal assist circuit means comprising:

first assist circuit means for coupling a first node of the signal line means to a first supply node for supplying the logical high signal level following a pullup transition of the signal from the logical low signal level towards the logical high signal level, and for providing a floating signal level to the first node following a pulldown transition of the signal from the logical high signal level towards the logical low signal level; and second assist circuit means for coupling a second node of the signal line means to a second supply node for supplying the logical low signal level following the pulldown transition, and for providing a floating signal level to the second node following the pullup transition.

Viewed from a further aspect, the present technique provides a method of operating an integrated circuit comprising a signal line for carrying a signal with a signal level at one of a logical low signal level and a logical high signal level depending on an output of predetermined circuitry, the method comprising:

following a pullup transition of the signal from the logical low signal level towards the logical high signal level, a first assist circuit coupling a first node of the signal line to a first supply node for supplying the logical high signal level, and a second assist circuit providing a floating signal level to a second node of the signal line;

following a pulldown transition of the signal from the logical high signal level towards the logical low signal level, the first assist circuit providing a floating signal level to the first node, and the second assist circuit coupling the second node to a second supply node for supplying the logical low signal level; and capturing the signal level of the signal line in a latch circuit.

Further aspects, features and advantages of the present technique will be apparent from the following detailed description which is to be read in conjunction with the accompanying drawings.

BRIEF DESCRIPTION OF THE DRAWINGS

FIG. 4B is a timing diagram showing a second example of operation of the memory shown in FIG. 2.

DESCRIPTION OF EXAMPLE EMBODIMENTS

Figure 1:
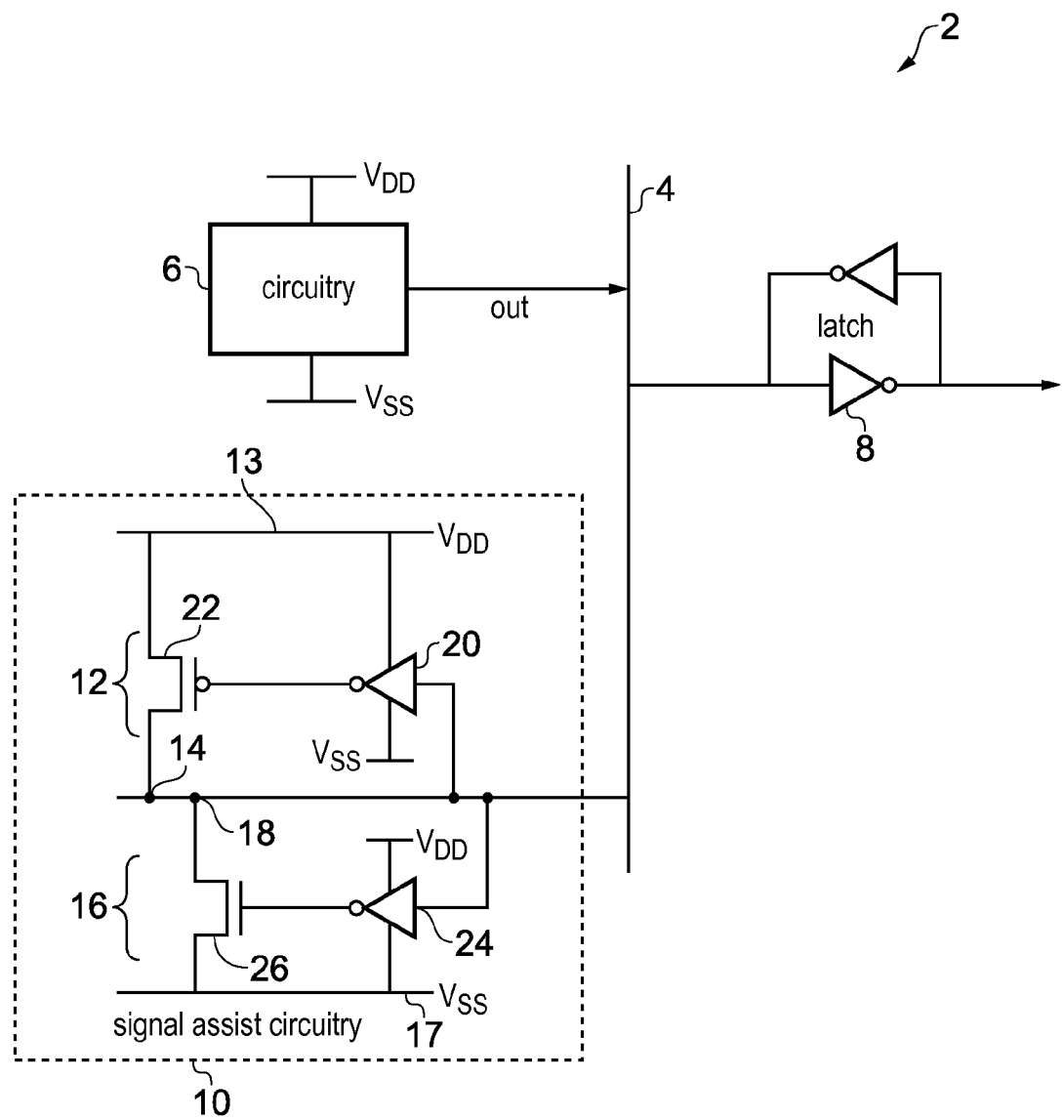
FIG. 1 schematically illustrates an integrated circuit having signal assist circuitry.

FIG. 1 schematically illustrates an integrated circuit 2 having a signal line 4 for carrying a signal whose signal level is dependent on an output of predetermined circuitry 6. The predetermined circuitry 6 may comprise any functional circuit for generating an output signal for the signal line 4. For example, the predetermined circuitry 6 may comprise a memory cell or a set of logic gates in a processing unit. The predetermined circuitry 6 need not be part of the integrated circuit 2. In some examples the predetermined circuitry 6 may be an external circuit which is coupled to a signal line 4 within the integrated circuit 2. A latch 8 is provided to capture the signal level on the signal line 4. Other circuits can then read the value of the signal line from the latch 8.

The operating frequency and voltage of the integrated circuit 2 are limited by several factors associated with the signal on the signal line 4. Firstly, when the predetermined circuitry 6 changes states so that the signal on the signal line 4 undergoes a state transition, then if the transition is relatively slow then the operating frequency must be reduced or the operating voltage increased to speed up the transition, to allow the latch to capture the new value. On the other hand, once the signal level on the signal line 4 reaches a given state, then it must remain at that state for enough time to allow the latch 8 to capture the signal level before the predetermined circuitry 6 starts changing state for a following processing cycle, again constraining the operating frequency or operating voltage. Hence, there is a limit to the performance and power savings which can be achieved by frequency or voltage scaling.

To address this issue, signal assist circuitry 10 is provided on the signal line 4 for assisting with pulling the signal level up towards the logical high signal level (VDD) or logical low signal level (VSS) and to retain the signal level 4 at its current level until the output circuitry 6 changes its output again. The signal assist circuitry 10 comprises a first assist circuit 12 coupled between a VDD supply rail (node) 13 and a first node 14 of the signal line 4, and a second assist circuit 16 coupled between a VSS supply rail (node) 17 and a second node 18 of the signal line. While FIG. 1 shows the first and second nodes 14, 18 as being different nodes of the signal line 4, in other examples they could be the same node.

The first assist circuit 12 assists with a pullup transition of the signal line 4 from the VSS level to the VDD level, while the second assist circuit 16 floats. On the other hand, the second assist circuit 16 assists with a pulldown transition from VDD to VSS, while the first assist circuit 12 floats. This is useful because it means that each of the first and second assist circuits 12, 16 can be sized and designed independently, so that they can be optimized for one of the pullup transition and pullup transition without having to compromise in order to handle the other transition.

The first assist circuit comprises a first inverter 20 which inverts the signal on the signal line 4 and provides the inverted signal to a gate of a PMOS transistor 22 which is coupled with its source and drain between the VDD supply rail 13 and the first node 14. This means that on a pullup transition, as the signal on the signal line 4 rises in response to the predetermined circuitry 6, it will eventually cause the inverter 20 to switch states so that its output drops to VSS, which then turns on the PMOS transistor 22. Once the PMOS transistor 22 is on, then the first node 14 is coupled to the VDD supply rail 13 and so this boosts the pullup transition, bringing the signal line 4 to the VDD level more quickly than would be the case if the first assist circuit 12 was not provided. While the signal line 4 remains at the VDD level, the first assist circuit 12 will retain the signal line 4 at VDD, fighting any competing pull down to VSS. For a pulldown transition, as the signal on the signal line 4 drops towards VSS in response to the predetermined circuitry 6, then the signal level passes beyond the threshold point of the first inverter 20, and so the inverter output will switch high and this will turn off the PMOS transistor 22, causing the output of the first assist circuit 22 to float. Therefore, following a pulldown transition of the signal line 4, the first assist circuit has no appreciable affect on the signal line 4.

Similarly, the second assist circuit 16 comprises a second inverter 24 which inverts the signal on the signal line 4, and the inverted output of the inverter 24 is provided to the gate of an NMOS transistor 26 which has its source and drain terminals coupled between the second node 18 and the VSS supply rail 17. Hence, on a pulldown transition of the signal line, the signal level will start dropping towards VSS, and when it drops past the threshold point of the second inverter 24, the inverter output will switch high, turning on the NMOS transistor 26. This couples the second node of the supply line to the VSS rail 17, thus accelerating the pulldown transition and bringing the signal line quickly to VSS. While the signal line 4 remains at VSS, the second assist circuit 16 will retain the signal at VSS, fighting any competing pullup to VDD. On a subsequent pullup transition, as the signal level on the signal line 4 rises, then the inverter 24 will switch its output low, and this will turn off the NMOS transistor 26, so that the output of the second assist circuit 16 floats.

Hence, the first and second assist circuit 12, 16 are complementary, so that each assists during and following one of the pullup and pulldown transitions, and is made floating for the other transition. This allows both the first and second assist circuits 12, 16 to be optimized to improve performance, power consumption and noise margin protection for the corresponding transition.

Figure 2:
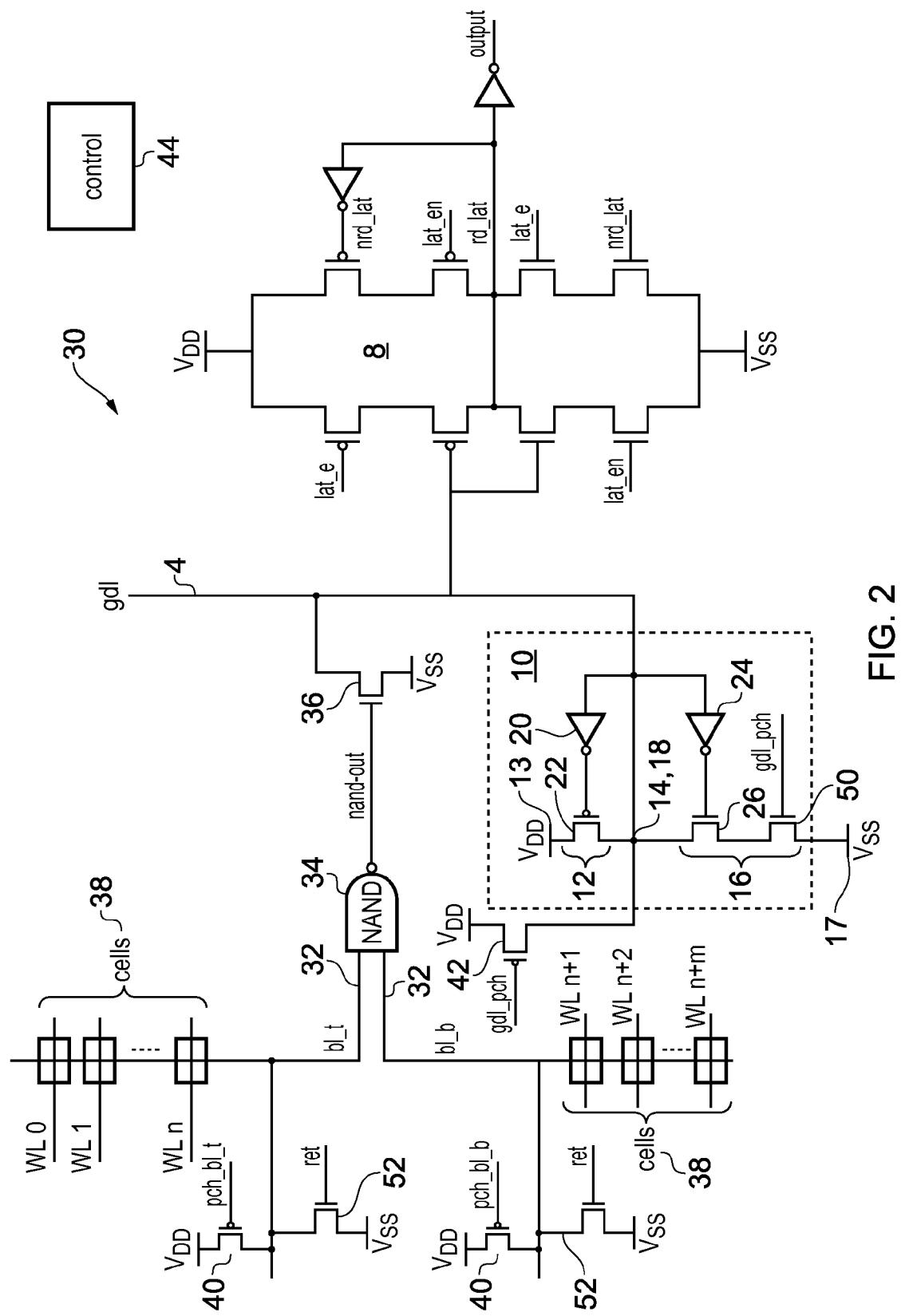
FIG. 2 illustrates a portion of a memory having signal assist circuitry coupled to a global bitline.

FIG. 2 shows a more specific example where the signal assist circuitry 10 is used in a memory 30 and the signal line 4 coupled to the signal assist circuitry 10 is a global bitline gdl of a hierarchical bitline structure of the memory 30. A number of local bitlines (bl) 32 are coupled to the global bitline gdl via a NAND gate 34 and global bitline evaluation circuitry 36. FIG. 2 shows two local bitlines 32, but it will be appreciated that there could be more than two local bitlines 32. Each of the local bitlines 32 is coupled to a group of memory cells 38. Each local bitline 32 has associated local bitline precharge circuitry 40 for precharging the local bitline 32 to the VDD level in response to a local bitline precharge signal pch_bl. Also, the global bitline 4 (gdl) has global bitline precharge circuitry 42 for precharging the global bitline gdl to the VDD level in response to a global bitline precharge signal gdl_pch. A latch 8 is provided to capture the signal level on the global bitline 4. FIG. 2 shows a particular example of a transistor arrangement for the latch 8, but other latch designs could also be used. Control circuitry 44 is also provided to generate the various control signals for the memory circuit 30, such as the wordline signals, the local and global bitline precharge signals and a latch enable signal lat_en for triggering the latch 8 to capture the value on the global bit line gdl.

Ahead of a read operation for reading a value from one of the memory cells 38, the local bitline precharge circuitry 40 switches on in response to the local bitline precharge signal pch_bl to precharge the local bitlines 32 to the VDD level. Also, the global bitline precharge circuitry 32 switches on to precharge the global bitline gdl to the VDD level. The control circuitry 44 then activates one of the wordlines wl to select a cell 38 to be read. In response to the activated wordline, the selected cell is coupled to the corresponding local bitline 32, and the local bitline 32 either remains at the precharged VDD level or drops to the VSS level depending on the state of the selected memory cell. The NAND gate receives multiple local bitlines 32 as inputs, and its output nand_out will be low if all of the local bitlines 32 remain at the VDD level and will switch high if one of the local bitlines 32 drops low in response to the selected memory cell state.

If the selected cell 38 has a first cell state (which is one of 0 and 1 depending on implementation of the memory cell), then the corresponding local bitline 32 will remain high, causing the NAND output to be low and turning off the global bitline evaluation transistor 36. Therefore, the global bitline gdl will remain high at its precharged VDD level, and this will be captured by the latch 8. The PMOS transistor 22 in the first assist circuit 12 retains the global bitline gdl in the VDD state to ensure that there is sufficient noise margin even if the wordline for the selected cell is then subsequently deactivated and the bitline 32 coupled to the cell starts to change states. This ensures that the latch 8 can capture the high global bitline signal level in time.

On the other hand, if the cell state of the selected cell is a second cell state (the other of 0 and 1) then the local bitline 32 coupled to that cell will drop low, causing the NAND output to switch high, turning on global bitline evaluation circuitry 36 to couple the global bitline gdl to the VSS level. The global bitline evaluation circuitry 36 will compete against the PMOS transistor 22 in the first assist circuit 12 which will try to keep the global bitline 4 at the VDD level of the supply rail 13 until the global bitline evaluation transistor 36 is able to pull the global bitline sufficiently low to activate the second assist circuit 16 which will then pull the global bitline rapidly down to VSS. The relative sizing of the PMOS transistor 22 and the global bitline evaluation transistor 36 can be selected to trade off performance versus leakage.

The signal assist circuitry 10 enables improved performance of the memory 30 following both the pullup and pulldown transitions of the signal line 4. Another advantage of the signal assist circuitry 10 is that it can enable the precharging of the local bitlines 32 by the local bitline precharge circuitry 40 to start earlier than would otherwise be the case. As the first and second assist circuits 12, 16 hold the global bitline 4 at its high or low signal level, this means that even if the NAND output of the NAND gate 34 starts to float, then the previous value on the global bitline gdl can still be captured by the latch 8. This means that the wordlines wl can be deactivated and the precharge circuitry 40 can start to precharge the local bitlines 32, before the latch 8 has finished capturing the level on the global bitline 4. This gives plenty of time for precharging the local bitlines 32. By starting the local bitline precharge slightly earlier, the operating frequency of the memory can be increased. Once the latch 8 has captured the signal from the global bitline, then the global bitline precharge can start using the global bitline precharge circuitry 42, and this just needs to complete by the time that the NAND gate 34 switches for the following read cycle. This means that the memory can operate at a higher speed.

In the example of FIG. 2, the second assist circuit 16 includes an additional tristating transistor 50 which is not present in the example of FIG. 1. The tristating transistor 50 allows the second assist circuit 16 to be placed in either a normal mode in which the operation is the same as discussed above for FIG. 1 or a tristate mode in which the tristating transistor 50 is made non-conductive so that the second assist circuit 16 provides a floating signal level to the second node 18 regardless of the current state of the signal line 4. This effectively brings the second assist circuit 16 out of action so that it does not affect the rest of the signal assist circuit 10. This is useful because during the precharging of the global bitline 4, the global bitline needs to be pulled up to the VDD level and if the second assist circuit 16 was still active then this would compete against the precharging operation so that the precharging is slower. By turning off the tristating transistor 50 using the global bitline precharge signal gdl_pch when precharging is required, the second assist circuit 16 can be tristated and then the first assist circuit 12 and precharge circuitry 42 can pull the global bitline gdl up to VDD more quickly. In examples other than a memory, a similar tristating transistor 50 may be provided in the second assist circuit 16 to implement a tristate mode, with the tristating transistor being controlled by a tristating signal other than the precharge signal gdl_pch.

The example of FIG. 2 also has some retention transistors 52 coupled to the local bitlines which enable a power saving mode to be implemented. When the retention signal ret is activated then these transistors gate the local bitlines 32 to VSS to reduce power consumption.

Figure 3:
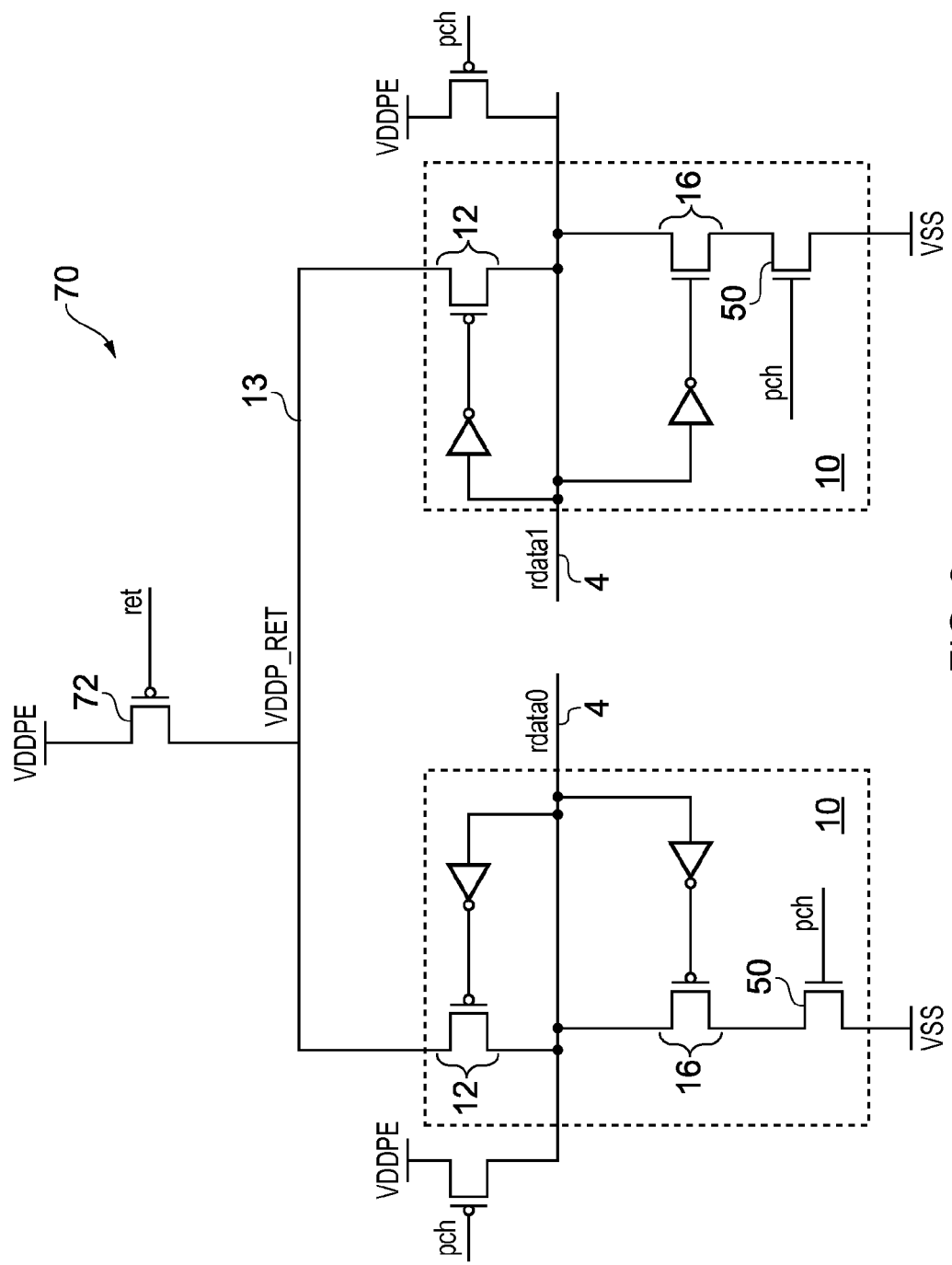
FIG. 3 shows another example of signal assist circuitry coupled to bitlines of a memory.

FIG. 3 shows another example of an integrated circuit 70 including the signal assist circuit 10. Multiple signal assist circuits 10 are provided for respective signal lines 4 which in this example are bitlines of a memory and may be either local bitlines or global bitlines. As in FIG. 2, the signal assist circuitry 10 in FIG. 3 has a tristating transistor 50 for supporting a tristate mode. Unlike in the preceding embodiments, the VDD supply rail 13 coupled to the first assist circuit is power gated using a power gating transistor 72. When the retention signal is high, the power gating transistor 72 is turned off so that the signal assist circuits 10 are deactivated. Hence, when the circuit 70 is inactive then power consumption can be reduced by blocking the power supply to the signal assist circuits 10. Otherwise, the operation is similar to that discussed for FIGS. 1 and 2.

Figure 4A:
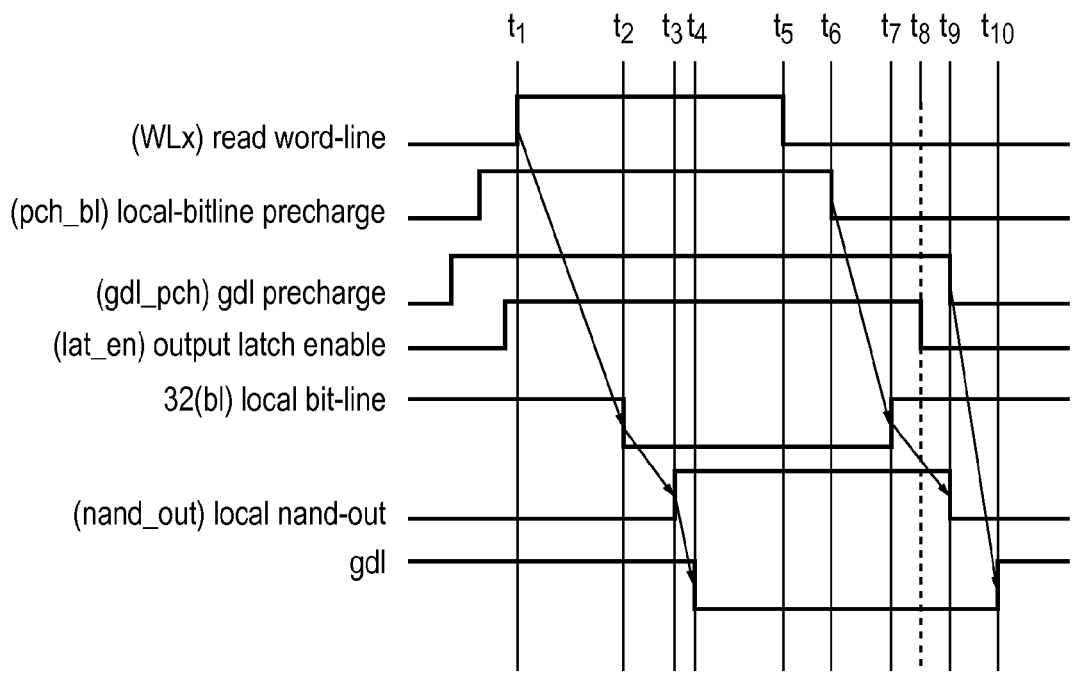
FIG. 4A is a timing diagram showing a first example of operation of the memory shown in FIG. 2.

FIG. 4A shows a first example of a timing diagram illustrating the operation of the memory circuit 30 of FIG. 2. At time $t_1$ the wordline WLx for a selected cell 38 is activated to trigger a read operation. This is done after the local bitlines 32 and global bitline 4 have already been precharged to VDD. At time $t_2$, the local bitline 32 drops low indicating that the selected memory cell stores a first cell state (0 or 1). At time $t_3$, the output of the NAND gate 34 switches high in response to the low value on the local bitline 32. At time $t_4$, the global bitline gdl drops low as the evaluation transistor 36 turns on in response to the high NAND output. At this time, the latch enable signal lat_en is high and so the latch 8 will capture the low value on the global bitline gdl at some point subsequent to time $t_4$. As the signal assist circuitry 10 will retain the global bitline gdl in the low signal state VSS, then even if the latch 8 has not yet captured the signal level of the global bitline gdl, at time $t_5$ the read wordline WLx for the selected cell 38 can be deactivated and the local bitline precharge signal pch_bl can then be brought low at time $t_6$ to trigger precharging of the local bitline 32 at time $t_7$. This will not affect the state of the global bitline gdl because it will be held at its current level by the signal assist circuitry 10. As the memory cell 38 stored the first cell state (corresponding to a low local bitline 32), then in this case the second assist circuit 16 holds the global bitline gdl at the VSS level following the pulldown transition at time $t_4$. Once the latch 8 has captured the value from the global bitline gdl then at time $t_8$ the latch enable signal is deactivated and the latch will now retain the captured value which can be read from the latch by other circuitry. At time $t_9$, the global bitline precharge signal gdl_pch is brought low to tristate the second assist circuit 16 and trigger precharging of the global bitline at time $t_{10}$. The memory is now ready for a subsequent read cycle. Hence, the signal assist circuit 10 enables fast operation because if it was not provided then the deassertion of the wordline and precharging of the local bitline at times $t_5$ to $t_7$ would have to wait until after the latch enable signal is deasserted at time $t_8$, slowing down operation.

On the other hand, if the state of the selected cell was a second cell state (the other of 0 and 1), then following time $t_2$ the local bitline would have stayed high causing the global bitline gdl 4 to remain in its high state. In this case, the first assist circuit 12 retains the global bitline gdl in the high state even if the precharging of the local bitline begins before the latch has captured the level of the global bit line gdl. Hence the signal assist circuit 10 provides assistance for both states of the global bitline.

FIG. 4B shows a second example of a timing diagram illustrating the operation of the memory circuit 30 of FIG. 2. FIG. 4B is the same as FIG. 4A, except that in this example the rising edge of the global bitline precharge signal gdl_pch may occur after the rising edge of the local bitline precharge signal pch_bl, whereas in FIG. 4A the rising edge of the global bitline precharge signal occurs before the rising edge of the local bitline precharge signal. Hence, in FIG. 4B both the rising and falling edges of the global bitline precharge signal gdl_pch are staggered with respect to the corresponding edges of the local bitline precharge signal pch_bl. The global bitline precharge signal has the same relation with the local NAND output signal as the local bitline precharge signal has with the read wordline.

Figure 5:
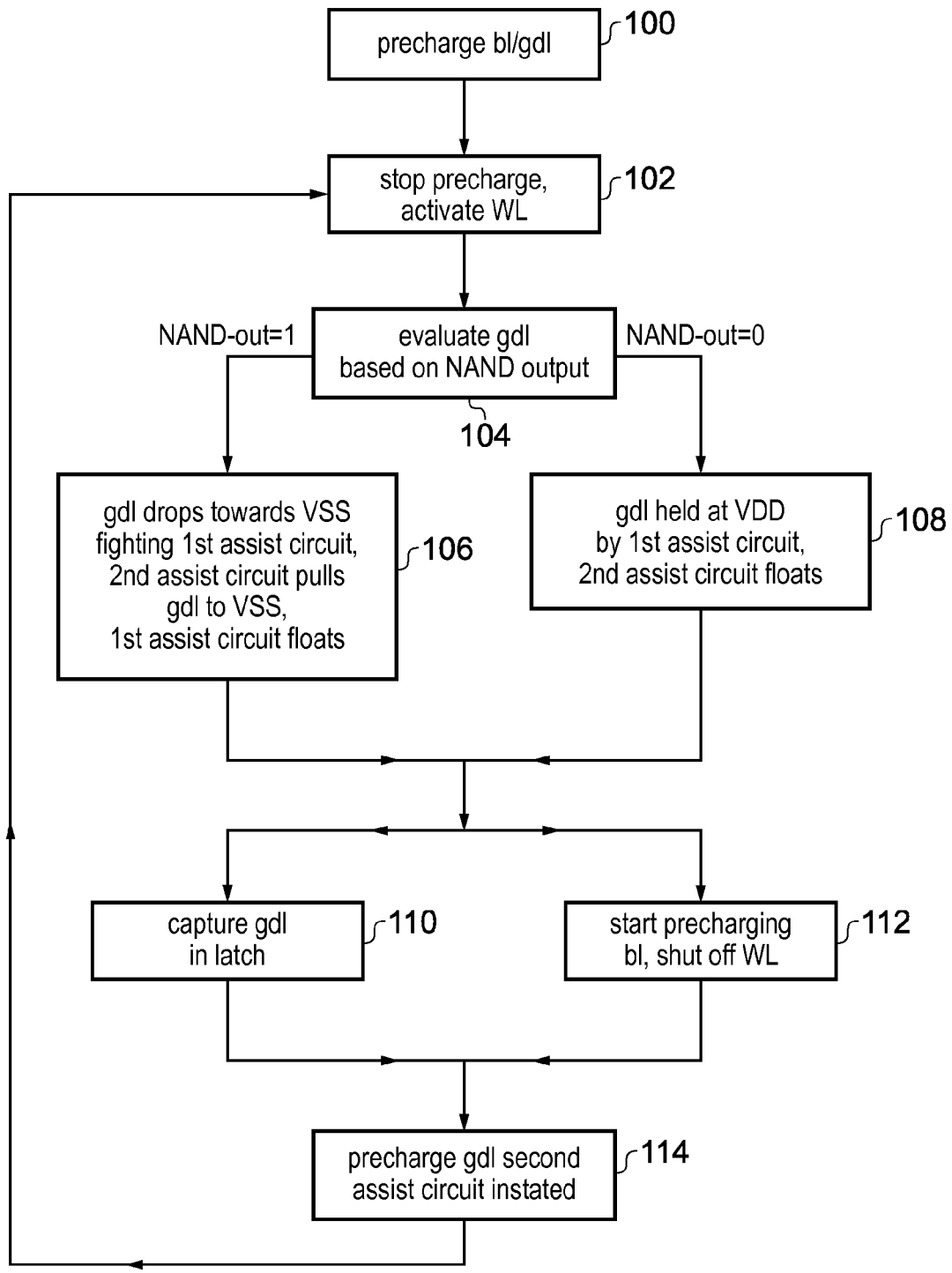
FIG. 5 is a flow diagram showing a method of operating the method of FIG. 2.

FIG. 5 illustrates a method of operating the memory of FIG. 2. At step 100 the local and global bitlines 32, 4 are precharged to the VDD by precharging circuitry 40, 42. At step 102 the precharging stops and the wordline for the selected cell is activated. At step 104 the global bitline evaluation circuitry 36 evaluates the output of the NAND gate 34. If the NAND output is logical high (1, indicating a first cell state comprising one of 0 and 1), then at step 106 the evaluation transistor 36 turns on and starts pulling the global bitline gdl towards VSS fighting the first assist circuit 12 which will try to keep the global bitline gdl in the VDD state. The relative sizing of transistors 22, 36 determines how fast this pulldown transition takes place. Once the global bitline signal has dropped below the threshold point for inverter 24 then the second assist circuit becomes active and pulls the global bitline gdl down to VSS quickly. The first assist circuit 12 now floats because inverter 20 flips states to turn off PMOS transistor 22. On the other hand, if the NAND output was logical low (0, indicating a second cell state comprising the other of 0 and 1) then the evaluation transistor 36 remains off. At step 108 the first assist circuit 12 remains on and holds the global bitline gdl at the VDD level and the second assist circuit 16 floats.

Regardless of the state of the global bit line gdl, at step 110 the latch 8 captures the current level of the global bitline gdl. Before or in parallel with step 110, the precharge circuitry 40 starts precharging the local bitlines 32 at step 112 and the selected wordline is shut off (deactivated). Even if the state of the local bitlines 32 starts to vary, the global bitline level will not float because it is held at its current level by one of the first and second assist circuits 12, 16. Once the global bitline level has been captured by the latch 8, then at step 114 the global bitline precharge circuitry 42 starts precharging the global bitline gdl to VDD and the second assist circuit 16 is tristated by tristating transistor 50. The method then returns to the step 102 for a subsequent read cycle.

In the memory example shown in FIGS. 2, 4 and 5, the second assist circuit 16 assists with the pulldown transition of the global bitline following a read, which is the transition which most limits performance, and the first assist circuit 12 is primarily for holding the global bitline gdl at the VDD level once it is already in the VDD state following an earlier pullup transition of the global bitline precharge circuitry 42. Nevertheless, on a pullup transition from VSS towards VDD, the first assist circuit 12 will still assist.

In other applications, the pullup transition may be equally significant to the pulldown transition, in which case the first assist circuit 12 will help this to be performed more quickly. Irrespective of which transition is more significant for the particular circuit application, the signal assist circuitry 10 having the circuit layout shown in the figures will nevertheless provide assistance for a pullup transition and a pulldown transition and will then cause the signal on the signal line 4 to be maintained at its current level following an earlier transition. Hence, the assistance provided "following a pullup transition" may encompass both the assistance provided during the pullup transition and the assistance provided when the signal is at the logical high signal level following an earlier pullup transition, and the assistance provided "following a pulldown transition" may encompass both the assistance provided during the actual pulldown transition, and the assistance provided when the signal is at the logical low signal level following an earlier pulldown transition.

Although illustrative embodiments of the present technique have been described in detail herein with reference to the accompanying drawings, it is to be understood that the invention is not limited to these precise embodiments, and that various changes and modifications can be made by one skilled in the art without departing from the scope of the invention as defined by the appended claims.

We claim:

1. A circuit, comprising: signal assist circuitry configured to assist with pulling a signal on a signal line towards a logical low signal level and to assist with pulling the signal on the signal line towards a logical high signal level, wherein the signal on the signal line has one of the logical low signal level and the logical high signal level depending on an output of predetermined circuitry, wherein the signal assist circuitry comprises:
   a first assist circuit configured to couple a first node of the signal line to a first supply node for supplying the logical high signal level following a pullup transition of the signal from the logical low signal level towards the logical high signal level, and configured to provide a floating signal level to the first node following a pulldown transition of the signal from the logical high signal level towards the logical low signal level; and
   a second assist circuit configured to couple a second node of the signal line to a second supply node for supplying the logical low signal level following the pulldown transition, and configured to provide a floating signal level to the second node following the pullup transition;
   wherein the second assist circuit comprises a transistor having a plurality of terminals and a gate, wherein one of the plurality of terminals directly couples to the second node of the signal line.

2. The circuit of claim 1,
   wherein the first assist circuit comprises a first inverter configured to invert the signal on the signal line to generate a first inverted signal, and a p-type transistor coupled between the first node and the first supply node, the p-type transistor having a gate terminal configured to receive the first inverted signal generated by the first inverter; and
   wherein the second assist circuit comprises the transistor and a second inverter configured to invert the signal on the signal line to generate a second inverted signal, wherein the transistor comprises a n-type transistor having the gate configured to receive the second inverted signal generated by the second inverter.

3. The circuit of claim 1, comprising precharge circuitry configured to precharge the signal line to the logical high signal level.

4. The circuit of claim 1, wherein the second assist circuit has a normal mode and a tristate mode;
   in the normal mode, the second assist circuit is configured to couple the second node to the second supply node following the pulldown transition, and to provide a floating signal level to the second node following the pullup transition; and
   in the tristate mode, the second assist circuit is configured to provide a floating signal level to the second node regardless of the signal level of the signal on the signal line.

5. The circuit of claim 4, wherein the second assist circuit comprises a tristating transistor coupled between the second node and the second supply node, the tristating transistor configured to decouple the second node from the second supply node during the tristate mode.

6. The circuit of claim 4, comprising precharge circuitry configured to receive a precharge signal having one of a first state and a second state, and configured to precharge the signal line to the logical high signal level in response to the first state of the precharge signal; and
   wherein the second assist circuit is configured to operate in the normal mode in response to the second state of the precharge signal and to operate in the tristate mode in response to the first state of the precharge signal.

7. An integrated circuit comprising the signal assist circuitry according to claim 1.

8. The integrated circuit according to claim 7, comprising:
   the signal line for carrying a signal with a signal level at one of the logical low signal level and the logical high signal level depending on an output of the predetermined circuitry; and
   a latch circuit configured to capture the signal level of the signal on the signal line.

9. The integrated circuit according to claim 8, wherein the integrated circuit comprises a memory.

10. The integrated circuit according to claim 8, wherein the signal line comprises a bitline of the memory.

11. The integrated circuit according to claim 8, wherein the signal line comprises a global bitline coupled to a plurality of local bitlines of the memory.

12. The integrated circuit according to claim 11, comprising local bitline precharge circuitry configured to precharge the local bitlines to the logical high signal level.

13. The integrated circuit according to claim 12, comprising control circuitry configured to control the local bitline precharge circuitry to start precharging the local bitlines before or in parallel with the latch circuit capturing the signal level of the global bitline.

14. The integrated circuit according to claim 13, wherein the signal assist circuitry is configured to maintain the signal level of the global bitline at one of the logical low signal level and the logical high signal level during the precharging the local bitlines until the latch circuit has captured the signal level of the global bitline.

15. The integrated circuit according to claim 12, comprising global bitline precharge circuitry configured to precharge the global bitline to the logical high signal level.

16. The integrated circuit according to claim 15, comprising control circuitry configured to control the local bitline precharge circuitry to start precharging the local bitlines before controlling the global bitline precharge circuitry to start precharging the global bitline.

17. The circuit of claim 1, wherein the first assist circuit and the second assist circuit are independent of each other.

18. The circuit of claim 17, wherein the sizing of the first assist circuit and/or the second assist circuit determines how fast a pulldown transition takes place.

19. A circuit, comprising:
  signal assist circuit means for assisting with pulling a signal on a signal line means towards a logical low signal level and assisting with pulling the signal on the signal line means towards a logical high signal level, wherein the signal on the signal line means has one of the logical low signal level and the logical high signal level depending on an output of predetermined circuitry, wherein the signal assist circuit means comprises:
    first assist circuit means for coupling a first node of the signal line means to a first supply node for supplying the logical high signal level following a pullup transition of the signal from the logical low signal level towards the logical high signal level, and for providing a floating signal level to the first node following a pulldown transition of the signal from the logical high signal level towards the logical low signal level; and
    second assist circuit means for coupling a second node of the signal line means to a second supply node for supplying the logical low signal level following the pulldown transition, and for providing a floating signal level to the second node following the pullup transition;
  wherein the second assist circuit comprises a transistor having a plurality of terminals and a gate, wherein one of the plurality of terminals directly couples to the second node of the signal line.

20. A method of operating an integrated circuit comprising a signal line for carrying a signal with a signal level at one of a logical low signal level and a logical high signal level depending on an output of predetermined circuitry, the method comprising:
  following a pullup transition of the signal from the logical low signal level towards the logical high signal level, a first assist circuit coupling a first node of the signal line to a first supply node for supplying the logical high signal level, and a second assist circuit providing a floating signal level to a second node of the signal line;
  following a pulldown transition of the signal from the logical high signal level towards the logical low signal level, the first assist circuit providing a floating signal level to the first node, and the second assist circuit coupling the second node to a second supply node for supplying the logical low signal level;
  wherein the second assist circuit comprises a transistor having a plurality of terminals and a gate, one of the plurality of terminals of the transistor directly coupling to the second node of the signal line.

* * * * *